(12) United States Patent
Hsu et al.

(10) Patent No.: US 7,545,253 B2
(45) Date of Patent: Jun. 9, 2009

(54) ELECTRONIC FUSE WITH CONFORMAL FUSE ELEMENT FORMED OVER A FREESTANDING DIELECTRIC SPACER

(75) Inventors: Louis Lu-Chen Hsu, Fishkill, NY (US); Jack A. Mandelman, Flat Rock, NC (US); William R. Tonti, Essex Junction, VT (US); Chih-Chao Yang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/128,100

(22) Filed: May 28, 2008

(65) Prior Publication Data
US 2008/0258857 A1 Oct. 23, 2008

Related U.S. Application Data

(63) Continuation of application No. 11/372,387, filed on Mar. 9, 2006, now Pat. No. 7,460,003.

(51) Int. Cl.
*H01H 85/08* (2006.01)
*H01L 23/62* (2006.01)
(52) U.S. Cl. .................. 337/159; 337/187; 337/295; 257/529
(58) Field of Classification Search .............. 337/159, 337/187, 295; 365/225.7; 257/50, 209, 529, 257/530, E21.592, E23.149, E23.147; 29/623
See application file for complete search history.

(56) References Cited

U.S. PATENT DOCUMENTS

| 597,969 | A | * | 1/1898 | Ferguson | 337/295 |
|---|---|---|---|---|---|
| 1,103,987 | A | * | 7/1914 | Murray | 337/248 |
| 4,349,804 | A | * | 9/1982 | Gaia | 337/198 |
| 4,382,289 | A | | 5/1983 | Saitoh | |
| 4,517,583 | A | | 5/1985 | Uchida | |
| 4,536,948 | A | | 8/1985 | Te Velde et al. | |
| 4,544,907 | A | * | 10/1985 | Takano | 337/262 |
| 4,570,147 | A | * | 2/1986 | Ebi | 337/166 |
| 4,630,355 | A | | 12/1986 | Johnson | |
| 4,661,793 | A | * | 4/1987 | Borzoni | 337/260 |
| 4,672,352 | A | * | 6/1987 | Takano | 337/264 |

(Continued)

FOREIGN PATENT DOCUMENTS

JP 60231350 A 11/1985

(Continued)

*Primary Examiner*—Anatoly Vortman
(74) *Attorney, Agent, or Firm*—Heslin Rothenberg Farley & Mesiti, PC (57) ABSTRACT

An electronic fuse for an integrated circuit and a method of fabrication thereof are presented. The electronic fuse has a first terminal portion and a second terminal portion interconnected by a fuse element. The fuse element has a convex upper surface and a lower surface with a radius of curvature at a smallest surface area of curvature less than or equal to 100 nanometers. Fabricating the electronic fuse includes forming an at least partially freestanding dielectric spacer above a supporting structure, and then conformably forming the fuse element of the fuse over at least a portion of the freestanding dielectric spacer, with the fuse element characterized as noted above. The dielectric spacer may remain in place as a thermally insulating layer underneath the fuse element, or may be removed to form a void underneath the fuse element.

12 Claims, 13 Drawing Sheets

U.S. PATENT DOCUMENTS

| | | |
|---|---|---|
| 4,747,076 A | 5/1988 | Mukai |
| 5,019,532 A | 5/1991 | Kaya |
| 5,420,456 A | 5/1995 | Galbi et al. |
| 5,572,409 A | 11/1996 | Nathan et al. |
| 5,618,750 A | 4/1997 | Fukuhara et al. |
| 5,644,281 A * | 7/1997 | Kuriyama .................. 337/295 |
| 6,512,284 B2 | 1/2003 | Schulte et al. |
| 6,879,018 B2 | 4/2005 | Marr et al. |
| 6,960,978 B2 | 11/2005 | Leigh et al. |
| 2003/0209734 A1 | 11/2003 | Kothandaraman |
| 2004/0209404 A1 | 10/2004 | Wang et al. |
| 2005/0219932 A1 | 10/2005 | Diorio et al. |

FOREIGN PATENT DOCUMENTS

| | | | |
|---|---|---|---|
| JP | 63246844 A | | 10/1988 |
| JP | 04280021 A | * | 10/1992 |
| JP | 05120985 A | | 5/1993 |

* cited by examiner fig. 1
(PRIOR ART)

fig. 2A fig. 2B fig. 3 fig. 4 fig. 5 fig. 6 fig. 7 fig. 8 fig. 9 fig. 10 fig. 11 fig. 12 fig. 13 fig. 13B fig. 13A fig. 14 fig. 15 fig. 16 fig. 17 fig. 18 fig. 19 fig. 20 fig. 21

ELECTRONIC FUSE WITH CONFORMAL FUSE ELEMENT FORMED OVER A FREESTANDING DIELECTRIC SPACER

CROSS-REFERENCE TO RELATED APPLICATIONS

This application is a continuation of U.S. patent application Ser. No. 11/372,387, filed Mar. 9, 2006, entitled "Electronic Fuse With Conformal Fuse Element Formed Over a Freestanding Dielectric Spacer", by Hsu et al., the entirety of which is hereby incorporated herein by reference. Further, this application contains subject matter which is related to the subject matter of the following commonly assigned applications, each of which is also hereby incorporated herein by reference in its entirety:

"Electrically Programmable Fuse Structures with Terminal Portions Residing at Different Heights, and Methods of Fabrication Thereof", by Hovis et al., U.S. patent application Ser. No. 11/372,334, filed Mar. 9, 2006, and published on Sep. 13, 2007 as U.S. Patent Application Publication No. 2007/0210411 A1; and "Electrically Programmable π-Shaped Fuse Structures and Methods of Fabrication Thereof", by Booth et al., U.S. patent application Ser. No. 11/372,380, filed Mar. 9, 2006, and published on Sep. 13, 2007 as U.S. Patent Application Publication No. 2007/0210412 A1; and "Electrically Programmable Fuse Structures with Narrowed Width Regions Configured to Enhance Current Crowding and Methods of Fabrication Thereof", by Booth et al., U.S. patent application Ser. No. 11/372,386, filed Mar. 9, 2006, and published on Sep. 13, 2007 as U.S. Patent Application Publication No. 2007/0210413 A1.

TECHNICAL FIELD

The present invention relates in general to semiconductor structures and methods of fabrication thereof, and more particularly, to fuse structures, and methods of fabrication thereof, which are electrically programmable employing typical integrated circuit operating voltages.

BACKGROUND OF THE INVENTION

Historically, repair of dynamic random access memory (DRAM) arrays is achieved by replacing defective word-lines or bit-lines with redundant word-lines or bit-lines, using a laser to open circuit fuses made of a conductive material. As devices continue to shrink, the relative size of these laser fuses is limited by the wavelength of the laser employed. Therefore, the size of the laser fuse cannot be shrunk indefinitely. Thus, such ablative laser-blown fuses become more difficult to implement due to the excessive silicon space required to avoid damage to neighboring circuits. Further, repairing an integrated circuit chip by open circuiting thousands of laser programmable fuses is a time consuming process.

An alternative fuse approach is to implement an electrically programmable fuse. One-time electrically programmable fuses, referred to as e-fuses, have become popular due to circuit and system design flexibility which they provide. For example, an e-fuse can be programmed even after the integrated circuit chip has been packaged and installed in the system (unlike the laser fuse approach). For instance, a customer can tailor a circuit design to the specific needs of the application after the circuit is installed in the field. An e-fuse also provides freedom to alter a circuit design, or fix a problem that may occur during the life of the product. Electrically programmable fuses are much smaller than ablative-type fuses, resulting in circuit density advantages. Although electrically programmable e-fuses provide these noted benefits, integration with standard CMOS processing has been problematic. Furthermore, obtaining a tight distribution of open circuiting voltages derived using today's normal operating voltages continues to be challenging. Existing e-fuses typically require voltages in excess of normal supply voltages for programming. As operating voltages continue to be aggressively scaled down with each succeeding generation of integrated circuit technology, obtaining sufficiently high voltages for programming an e-fuse can tax the electrical operating limits of the technology, and increase circuit complexity, for example, due to the need for charge pumps.

In view of this, there remains a need in the art for enhanced electrically programmable fuses, and methods of fabrication thereof, which may be readily programmed with today's on-chip operating voltages, and be readily integrated with standard semiconductor circuit fabrication processing.

SUMMARY OF THE INVENTION

Briefly summarized, the present invention comprises in one aspect a fuse for an integrated circuit. The fuse includes a first terminal portion and a second terminal portion interconnected by a fuse element. The fuse element has a convex upper surface and a lower surface with a radius of curvature at a smallest surface area of curvature less than or equal to 100 nanometers.

The fuse element resides either over a void in a supporting structure or above a thermally insulating, dielectric spacer. In one implementation, the upper surface of the fuse element is convex for a majority of the distance between the first terminal portion and the second terminal portion. Further, the lower surface of the fuse element can be vertically straight for a portion thereof. The first terminal portion can be electrically contacted from both above and below (via an underlying metal) and the second terminal portion is electrically contacted only from above, with a dielectric material being disposed below. The fuse is an electrically programmable fuse with a minimum overall length less than 70 nanometers, and a fuse element with a width of minimum thickness less than or equal to 5 nanometers. The fuse can be fabricated to be programmable employing the operating voltage of today's integrated circuit. Enhanced current density, heat generation and temperature rise are obtained in a region of the fuse element adjacent to the smallest area of curvature of the lower surface having the radius curvature less than or equal to 100 nanometers.

In another aspect, a method of fabricating a fuse for an integrated circuit is provided. The method includes: forming a freestanding dielectric spacer above a supporting structure; and conformably forming a fuse element of the fuse over at least a portion of the freestanding dielectric spacer, wherein the fuse element has a convex upper surface and a lower surface with a radius of curvature at a smallest surface area of curvature less than or equal to 100 nanometers.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

Recently developed e-fuse structures take advantage of electro-migration (EM) effects to overcome some of the above-noted problems of achieving scaling of programming voltage. The EM effect, caused by a positive divergence of the ionic flux, leads to an accumulation of vacancies, forming voids in the metal. Voids are formed inside of the metal conductors due to metal ion movement caused by momentum transfer from the electron flux at high current density. The void growth rate is a function of both temperature and current density, and therefore, the site having the smallest cross-sectional area in an interconnect tends to form voids first.

Thus, it is advantageous to somehow increase the local current density in the fuse element.

Figure 1:
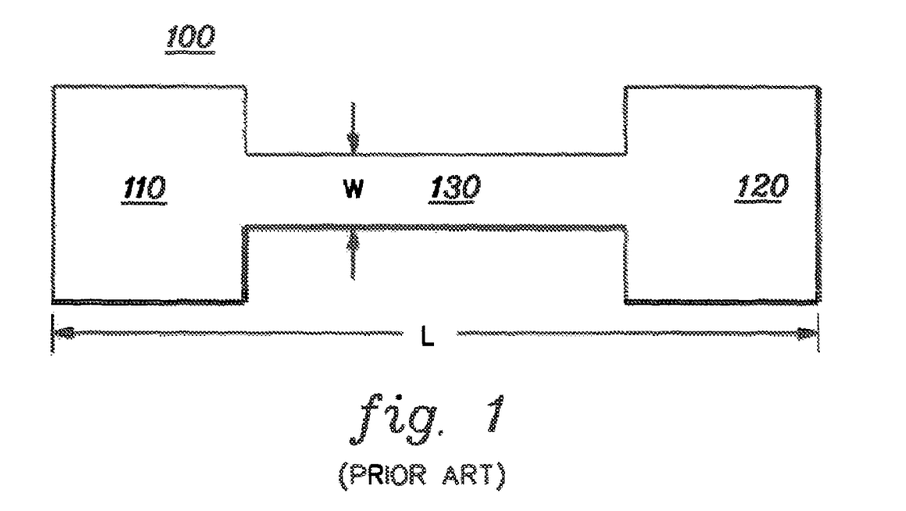
FIG. 1 is a plan view of one embodiment of a prior art two-dimensional "dog-bone" shaped electronically programmable fuse.

One approach to increasing local current density is depicted in FIG. 1, wherein the plan view layout of the illustrated electronic fuse 100 is a two-dimensional "dog-bone" shape. Fuse 100, which employs in-plane dimensional differences to locate an open circuit site via a localized high electron/current flow, includes a large cathode pad 110 and a large anode pad 120, between which a small cross-section interconnect 130 is disposed. This configuration has been adopted in the semiconductor industry as a basic e-fuse design. Although this e-fuse design alleviates some of the above-noted problems of scaling, size and programming energy requirements, there is still a need for further progress in these areas to meet requirements below the 65 nm technology level. By way of example, with current 65 nm back end of line technology, the electrically programmable fuse 100 illustrated in FIG. 1 might have an interconnect 130 width W greater than 90 nm, and an overall length L greater than 800 nm. Thus, programming efficiency of this fuse implementation is limited by width W, which depends on available lithography resolution, and technology extendibility is restricted by the overall length L of the fuse.

Further, a need remains for e-fuse structures which can be readily programmed employing today's on-chip operating voltages, for example, in the range of 1 to 3 volts. The e-fuse structures presented herein meet this requirement. In addition, methods of forming novel e-fuse structures are presented which can be easily and economically integrated with standard semiconductor processing at front end of line (FEOL), back end of line (BEOL), or far back end of line (FBEOL). The e-fuse structures presented herein have a physical size which can be scaled with each successive technology generation, and can be rapidly programmed, thus allowing (for example) efficient enablement of redundant cells in memory arrays.

Generally stated, presented herein is a fuse structure which includes a conductive line or fuse element conformably formed over a freestanding spacer. The spacer is a sacrificial spacer (in one embodiment) that is, subsequently removed, providing a void in which melted fuse metal may flow. Since the melt line is conformably formed over the spacer, it maintains the shape of the spacer when the spacer is removed. The spacer is configured so that the conformably formed fuse element has a substantially convex upper surface and a lower surface with a radius curvature at a smallest surface area of curvature less than or equal to 100 nanometers. This small surface curvature region results in enhanced current density, heat generation and temperature rise within the fuse element near the region of smallest surface area of curvature when current is passed through the fuse element. By way of example, the fuse element has a smallest radius of curvature disposed in an upper portion of the fuse element, and somewhat larger radii of curvature near its base. The local "hot spot" in the upper portion of the fuse element reduces the magnitude of the line current, and hence, forcing voltage, required to open circuit the fuse. Thus, the fuse structure presented exploits both a small radius of curvature in the fuse element, and a thermally isolative property, for example, of the void below the fuse element, to result in a reduced open circuit current/voltage compared with existing e-fuses.

Figure 2A:
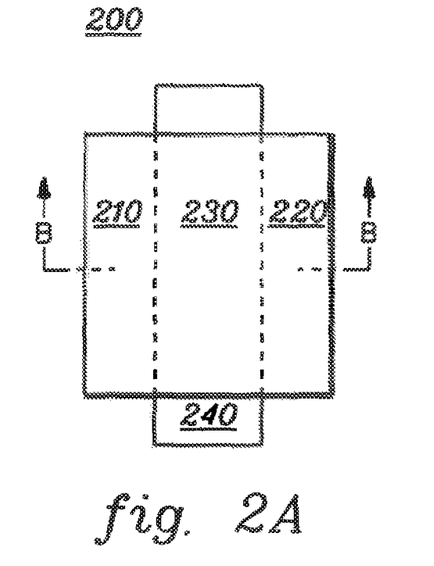
FIG. 2A is a top plan view of one embodiment of an electrically programmable fuse structure, in accordance with an aspect of the present invention.
Figure 2B:
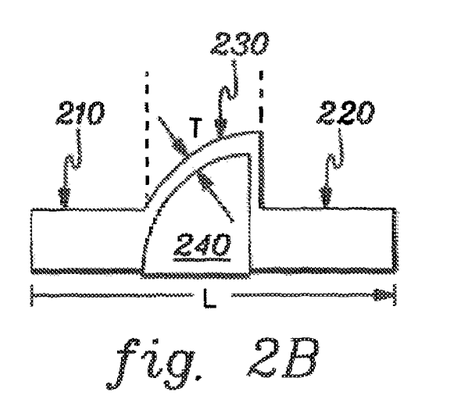
FIG. 2B is a cross-sectional elevational view of the electrically programmable fuse structure of FIG. 2A, taken along line B-B, in accordance with an aspect of the present invention.

FIGS. 2A & 2B depict one embodiment of a fuse, generally denoted 200, comprising a first terminal portion 210 and a second terminal portion 220 interconnected by a fuse element 230. In this embodiment, fuse 200 is a rectangular-shaped structure when viewed planarly. Fuse element 230 resides at least partially over a spacer 240, which in one embodiment is a sacrificial spacer to be subsequently removed (discussed further below). As illustrated in FIG. 2B, the thickness T of fuse element 230 in the region above spacer 240 (which may be less than or equal to five nanometers) is smaller than the fuse's thickness in the horizontal regions defining first terminal portion 210 and second terminal portion 220. The minimum length L of fuse 200 may be less than 70 nanometers. As explained further below, this fuse structure presents high programming efficiency, enhanced technology extendibility, and can be implemented in front end of line (FEOL), back end of line (BEOL), and/or far back end of line (FBEOL) processing.

Various approaches for fabricating an electrically programmable fuse structure are depicted in FIGS. 3-21 and described below, in accordance with aspects of the present invention. With the exception of FIGS. 13A, 13B, 14 & 15, which illustrate a single fuse element, fabrication of two series-connected fuse elements is depicted. These dual fuse elements may be employed as separate electrically programmable fuses, or as two series-connected fuses for enhanced reliability.

Figure 3:
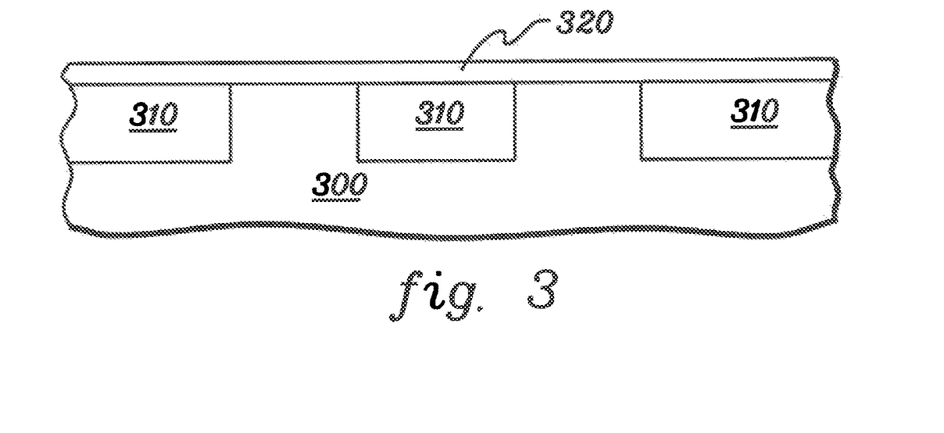
FIG. 3 is a partial cross-sectional view of an intermediate structure obtained during a fuse fabrication approach, in accordance with an aspect of the present invention.

Referring to the intermediate process structure of FIG. 3, a dielectric film 320 is shown deposited on a surface of, for example, a wafer, with metal interconnects 310 embedded in an insulator layer 300. This intermediate structure assumes that a starting substrate (not shown) has already been processed according to standard semiconductor processing methods, and that the depicted structure is a portion of the processed wafer following formation of one of a plurality of metal wiring levels 310 at BEOL. By way of example only, dielectric film 320 is one of silicon nitride ($Si_3N_4$), silicon carbide (SiC), nitrogen and hydrogen doped silicon carbide (SiC (N, H)), or silicon oxide ($SiO_2$), while electrically conductive material 310 is copper, aluminum, aluminum-copper alloy, or tungsten, and dielectric layer 300 has a thickness, for example, between 500 and 10,000 angstroms. Typical insulating or dielectric materials 300 include silicon dioxide ($SiO_2$), phosphosilicate glass (PSG), boron doped PSG (BDPSG), or tetraethylorthosilicate (TEOS), and more typically low-k dielectrics having a dielectric constant of less than 3.9 such as SILK (available from Dow Chemical), SiCH (available from AMAT under the trade designation BLOK), SiCOH (available from Novellus under the trade designation Coral, from AMAT under the trade designation Black Diamond and from ASM under the trade designation Auora), SiCHN (available from IBM under the trade designation NBlok), CVD carbon-doped oxide, porous CVD carbon-doped oxide, porous and non-porous organo silicates, porous and non-porous organic spin-on polymers.

Figure 4:
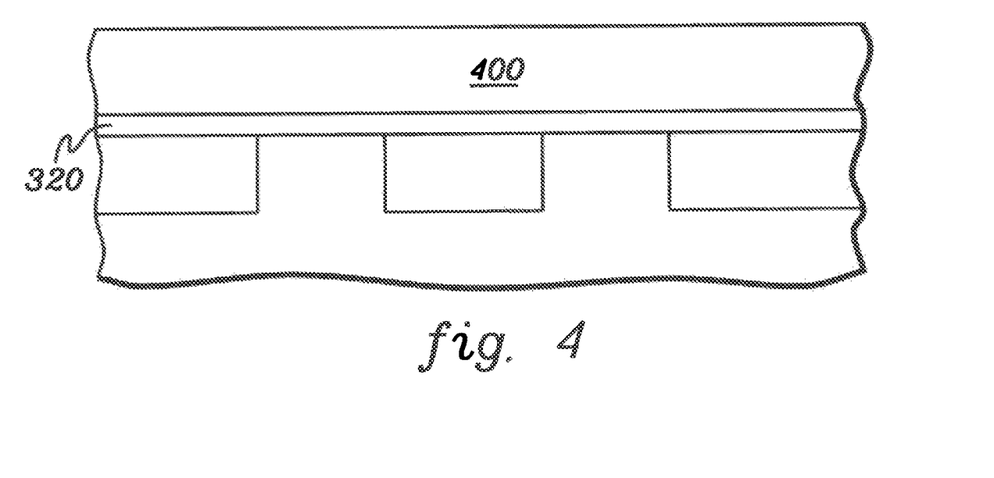
FIG. 4 is a cross-sectional elevational view of the structure of FIG. 3 after deposition of a dielectric material 400 over the intermediate structure, in accordance with an aspect of the present invention.

FIG. 4 depicts the intermediate structure of FIG. 3 after a second dielectric material 400 has been deposited on dielectric film 320. Material 400 may be the same material as layer 300.

Figure 5:
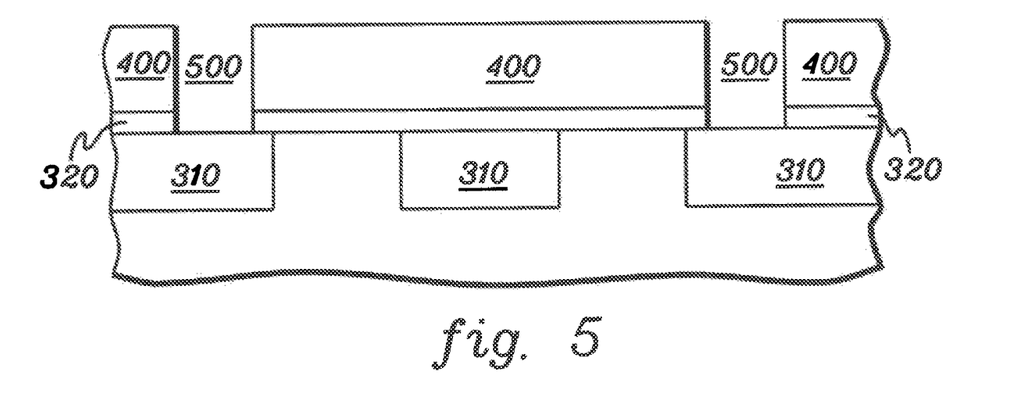
FIG. 5 is a cross-sectional elevational view of the intermediate structure of FIG. 4 after patterning of the deposited dielectric material 400 and etching of vias 500 to selectively expose underlying metal 310, in accordance with an aspect of the present invention.

FIG. 5 is a cross-sectional elevational view of the structure of FIG. 4 after one or more contact vias 500 have been etched through material 400 and film 320 using conventional masking and etching processes. Vias 500 are patterned to selectively expose underlying metal 310. For example, directional, anisotropic or reactive ion etching can be used to produce the depicted vias 500.

Figure 6:
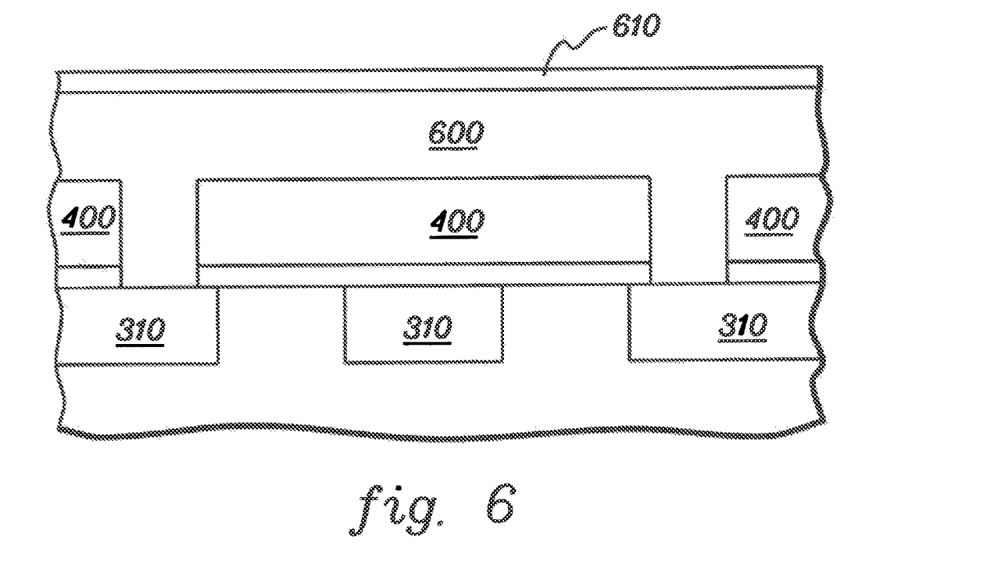
FIG. 6 is a cross-sectional elevational view of the intermediate structure of FIG. 5 after deposition and planarization of an organic material 600 to fill the via openings, and the formation of a further dielectric layer 610 over the organic material, in accordance with an aspect of the present invention.

An organic planarizing material 600 is then deposited and planarized to fill the at least one via opening in material 400, covering the previously exposed underlying metal 310 as illustrated in FIG. 6. A layer of dielectric material 610 is deposited on top of planarizing material 600. By way of example only, layer 610 is a low temperature deposited oxide (LTO), such as silicon oxide, silicon nitride, silicon carbide, nitrided silicon carbide or hydrogenated silicon carbide. Deposition processes for organic planarizing material 600 and dielectric layer 610 include spin-on films, CVD, PECVD, evaporation, chemical solution deposition and other like deposition techniques. CMP or grinding may be used to planarize the deposited organic planarizing material 600 before deposition of dielectric layer 610. By way of example only, organic material 600 is any commercially available material, such as spin-on organic planarizing material available from: JSR Corporation of Tokyo, Japan; Promerus, LLC of Brecksville, Ohio; Shin-Etsu Chemical Co., Ltd. of Tokyo, Japan; or Brewer Science, Inc. of Rolla, Mo.

Figure 7:
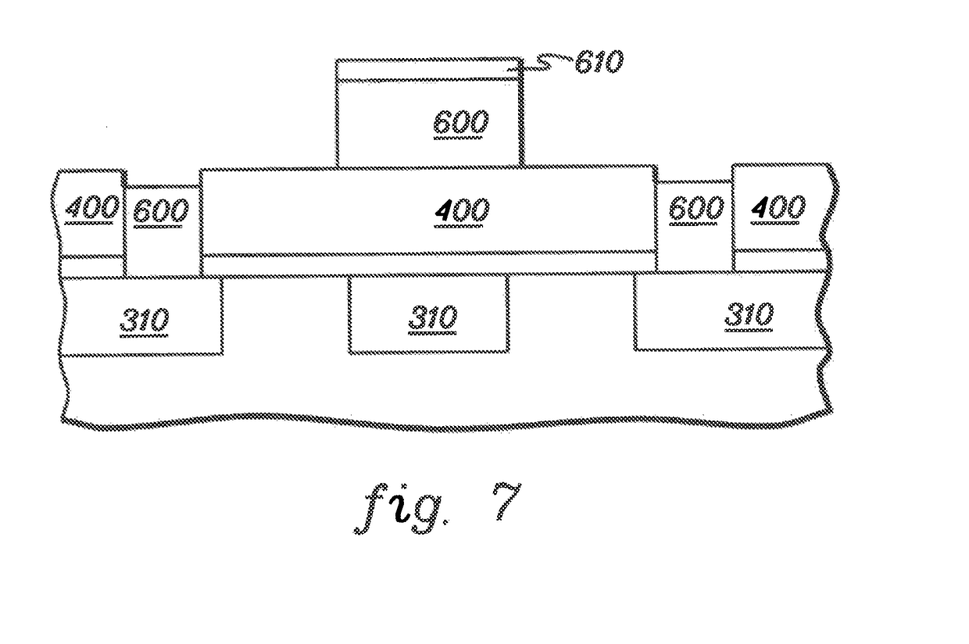
FIG. 7 is a cross-sectional elevational view of the intermediate structure of FIG. 6, after areas for building fuse structures are defined by masking an opening in the top dielectric layer 610 and the adjacent organic material 600, in accordance with an aspect of the present invention.

FIG. 7 depicts the structure of FIG. 6, after an open area and a stack 600, 610 for building the fuse structures have been defined by masking an appropriately configured opening in dielectric layer 610 and planarizing material 600. In a plan view of the wafer, the areas for the fuse structures may comprise rectangular openings in the dielectric and planarizing materials 610, 600 to allow formation, for example of rectangular fuse structures (such as depicted in FIG. 2A). These rectangular openings would expose a portion of the upper surface of dielectric material 400, as well as the upper surfaces of organic material 600 disposed within the vias, and protecting underlying metal 310.

Figure 8:
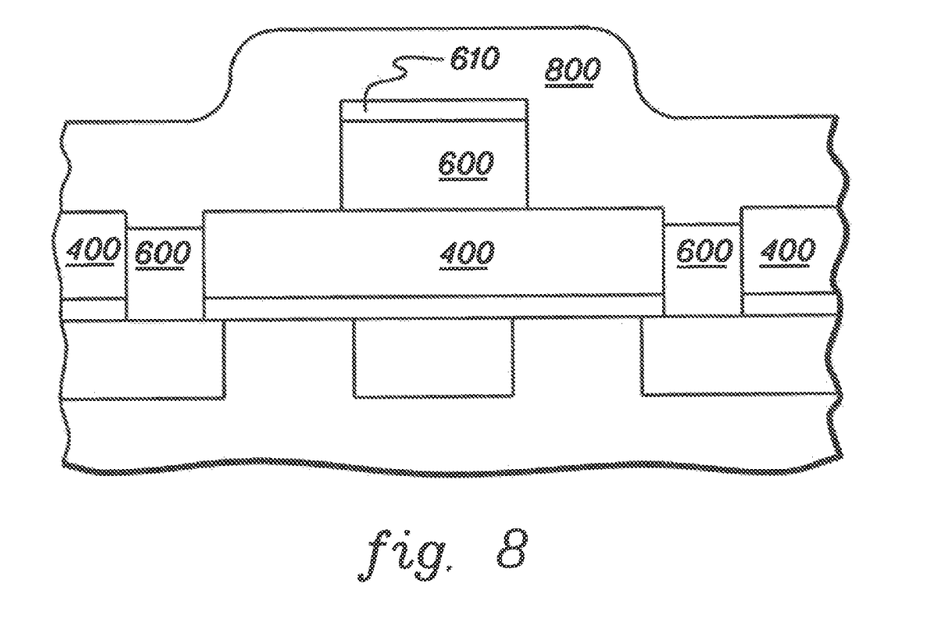
FIG. 8 is a cross-sectional elevational view of the intermediate structure of FIG. 7 after deposition of a sacrificial spacer material 800 over the intermediate structure, in accordance with an aspect of the present invention.

A sacrificial (in one embodiment) spacer material 800 is then deposited over material 400, material 600 and dielectric 610 as shown in FIG. 8. Material 800 is, for example, germanium, silicon nitride, silicon carbide, a hydrogenated silicon carbide or nitrogenated silicon carbide. Germanium is particularly beneficial in facilitating selective removal of the sacrificial spacer in a subsequent processing step, as discussed further below.

Figure 9:
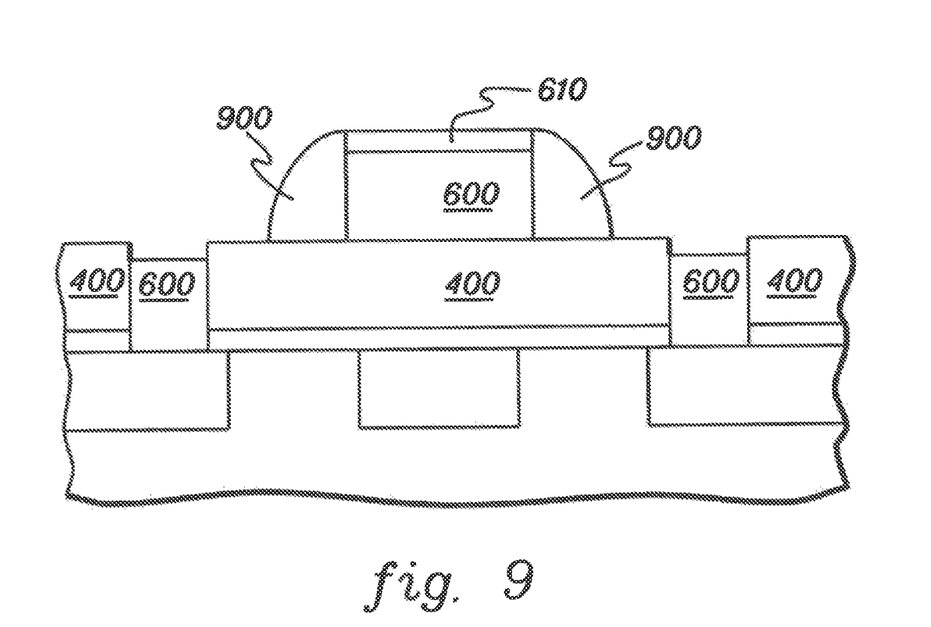
FIG. 9 is a cross-sectional elevational view of the structure of FIG. 8, after directional reactive ion etching of the sacrificial spacer material to form sidewall spacers 900, in accordance with an aspect of the present invention.
Figure 10:
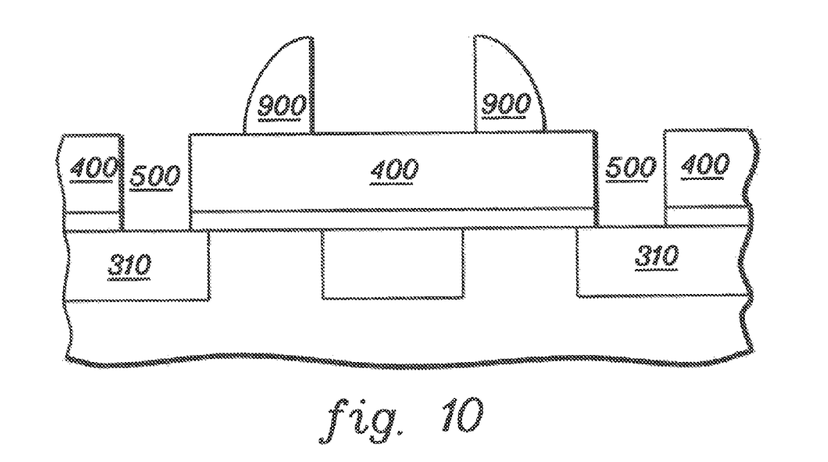
FIG. 10 is a cross-sectional elevational view of the intermediate structure of FIG. 9, after conventional oxide etching of layer 610 and removal of the organic material 600 to create freestanding dielectric spacers 900 disposed above the supporting structure, with via openings 500 selectively exposing underlying metal 310, in accordance with an aspect of the present invention.

A directional reactive ion etch (RIE) is used to remove material 800 from the horizontal surfaces of the intermediate structure of FIG. 8, exposing (in this example) materials 400 & 610, and resulting in sidewall spacers 900 on the stack formed by material 600 and dielectric 610, as shown in FIG. 9. The low temperature oxide 610 is then removed by conventional oxide etching, and the organic material 600 is stripped out. Removing dielectric 610 and organic material 600 creates, in one embodiment, a dull edge at the top of spacers 900. This slight rounding of the upper edge of spacers 900 adjacent to the vertical portions thereof facilitates subsequent metal coverage. The resultant spacers 900 are free-standing dielectric spacers disposed above the supporting structure 400, as shown in FIG. 10. FIG. 10 also illustrates that vias 500 selectively expose underlying metal 310.

Figure 11:
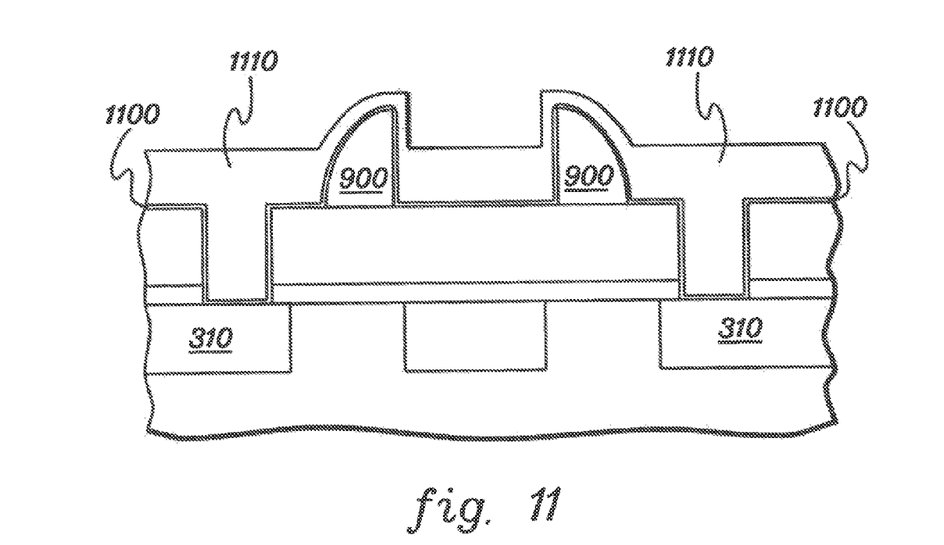
FIG. 11 is a cross-sectional elevational view of the structure of FIG. 10, after formation of a diffusion barrier layer 1100 and deposition of a conductive material 1110 over the exposed upper surface of the intermediate structure, in accordance with an aspect of the present invention.

As shown in FIG. 11, a conductive diffusion barrier or liner material 1100 is next deposited (including over exposed metal 310 and spacers 900), on top of which a conductive material 1110 is also deposited. The diffusion barrier material 1110 is, for example, tantalum nitride, tantalum, titanium, titanium nitride, or combinations thereof. In standard BEOL terminology, liner 1100 is referred to as the terminal metal level liner. The conductive material 1110 is, for example, a metal, such as aluminum or an alloy of aluminum and copper. Metal level 1110 is conformal as shown, but may be deposited with conditions making the metal conformal with certain directional components. For example, where there is a vertical component to the surface that the metal is being conformably deposited on, the deposition need not result in a full thickness compared with a horizontal surface. Thus, a structure such as depicted in FIG. 11 is obtained, wherein layer 1110 is thinner over the roughly convex exposed surfaces of the spacers 900.

Figure 12:
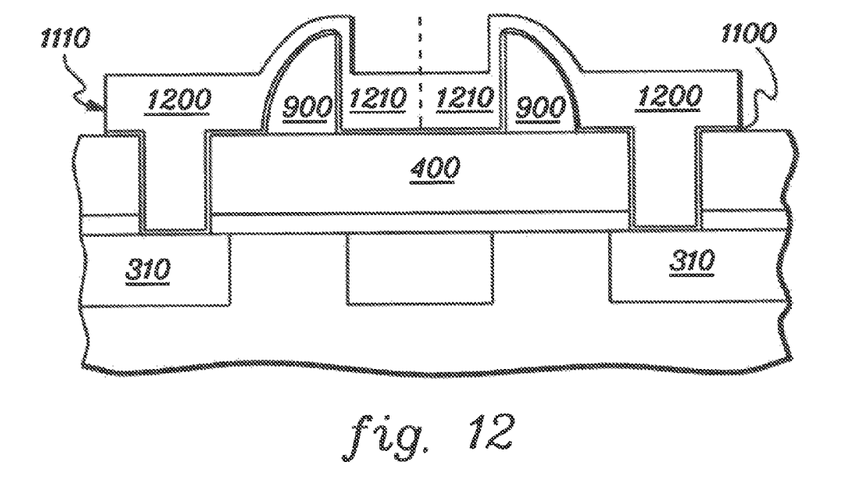
FIG. 12 is a cross-sectional elevational view of the structure of FIG. 11, after fuse areas have been defined by patterning and removing unneeded regions of the diffusion barrier material 1100 and overlying conductive material 1110, and (in one embodiment) the sacrificial material has been partially exposed as shown in FIG. 2A, in accordance with an aspect of the present invention.

Fuse structures are defined by patterning and etching metal level 1110 and metal liner 1100 resulting in the structure shown in FIG. 12. In FIG. 12, two series-connected e-fuse structures are shown, separated by the vertical dashed line in the middle of the figure. Each e-fuse structure includes a first terminal portion 1200 and a second terminal portion 1210. First terminal portion 1200 is electrically connected to an underlying metal 310, while second terminal portion 1210 is disposed atop dielectric material 400. Once the metal has been patterned, dielectric spacers 900 may either be removed, as in the embodiment of FIGS. 13-16, or remain, as in the embodiment of FIGS. 19-21. The embodiment of FIGS. 13-16 is described first.

Figure 13:
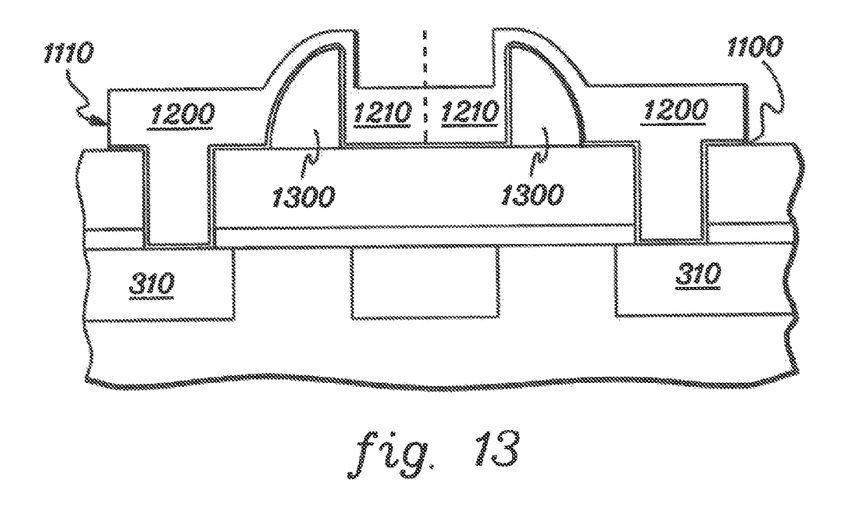
FIG. 13 is a cross-sectional elevational view of the structure of FIG. 12, after the exposed sacrificial material has been selectively removed relative to the other materials, resulting in voids 1300 underneath regions of the overlying metal conformably shaped by the sacrificial material, in accordance with an aspect of the present invention.

Once the metal has been patterned, the sacrificial spacer material is partially exposed (as shown in FIG. 2A), and can be selectively removed relative to the other materials as shown in FIG. 13. For sacrificial spacers made of germanium, an etch in a hydrogen-peroxide solution may be used for selective removal. The voids 1300 underneath the respective fuse elements provide a region into which the open circuited fuse material may melt.

Figure 13A:
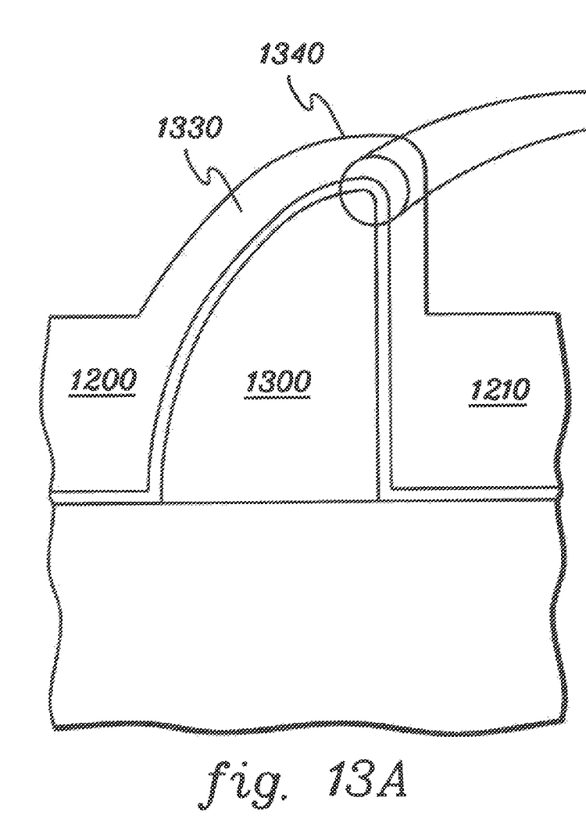
FIG. 13A is an enlarged view of one embodiment of an electrically programmable fuse portion, in accordance with an aspect of the present invention.

FIG. 13A is a partially enlarged depiction of one fuse structure such as depicted in FIG. 13. This fuse structure includes a first terminal portion 1200 and a second terminal portion 1210 between which is disposed a fuse element 1330. Fuse element 1330 has an upper surface 1340 which is substantially convex in configuration, although in this embodiment, a portion thereof is vertically straight. Further, in this configuration, upper surface 1340 of fuse element 1330 is substantially convex from the first terminal portion 1200 to the second terminal portion 1210. The thickness of the fuse structure is shown to vary between the horizontally disposed terminal portions 1200, 1210 and the vertically protruding fuse element 1330.

Figure 13B:
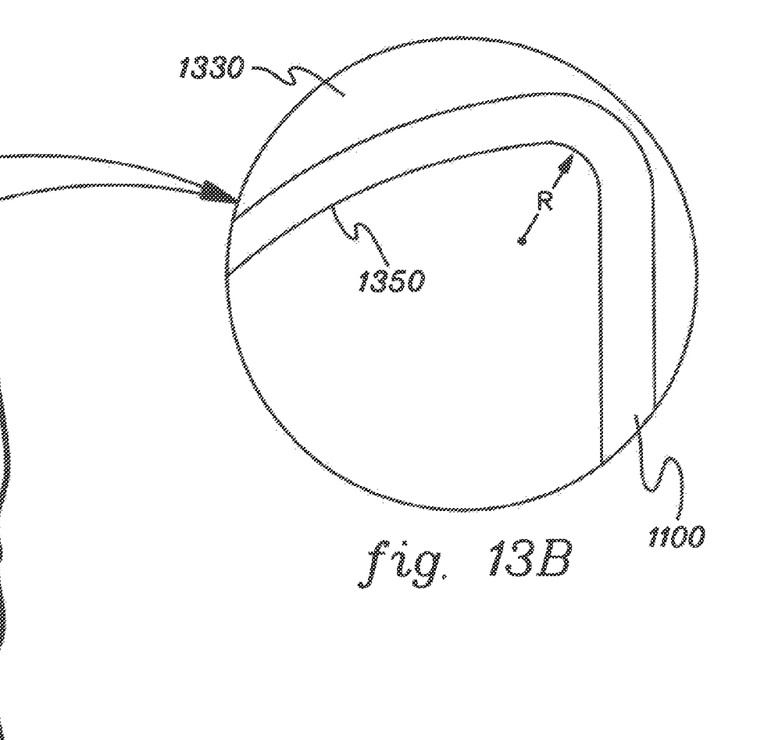
FIG. 13B is a partially enlarged view of a lower surface of the fuse element of FIG. 13A, showing a region having a smallest surface area of curvature and identifying the radius of curvature thereof, in accordance with an aspect of the present invention.
Figure 14:
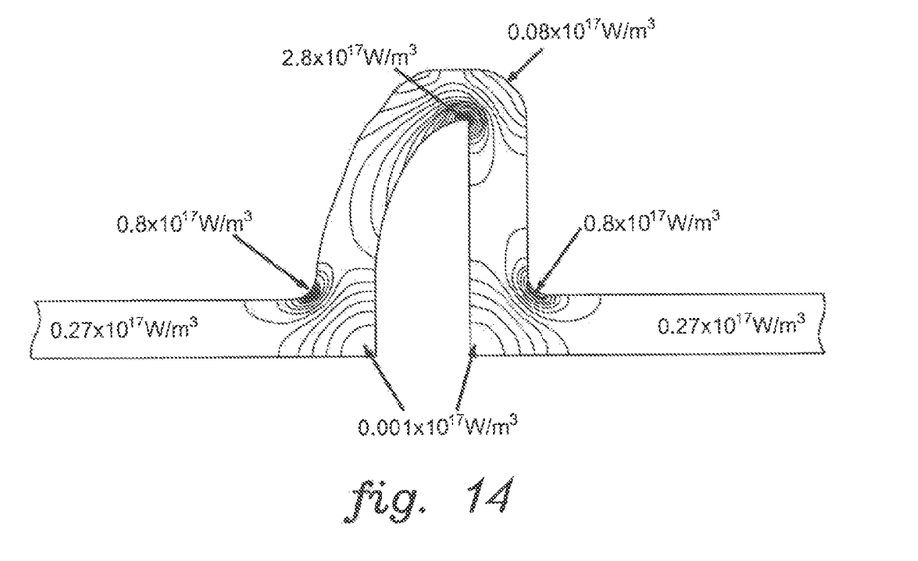
FIG. 14 is an exemplary depiction of temperature contours resulting from a current passing through the fuse element of FIG. 13A, in accordance with an aspect of the present invention.
Figure 15:
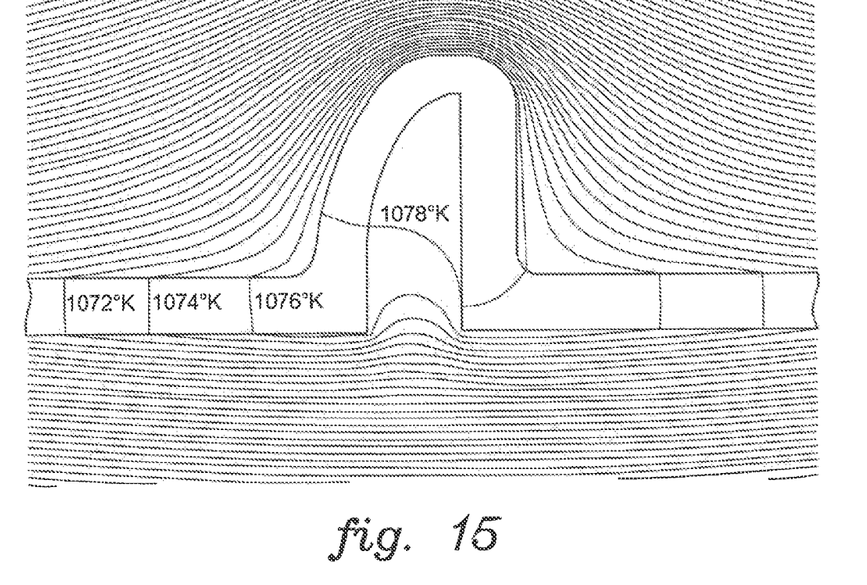
FIG. 15 is a depiction of the fuse element of FIG. 14, showing exemplary heat flux away from the fuse element, in accordance with an aspect of the present invention.
Figure 16:
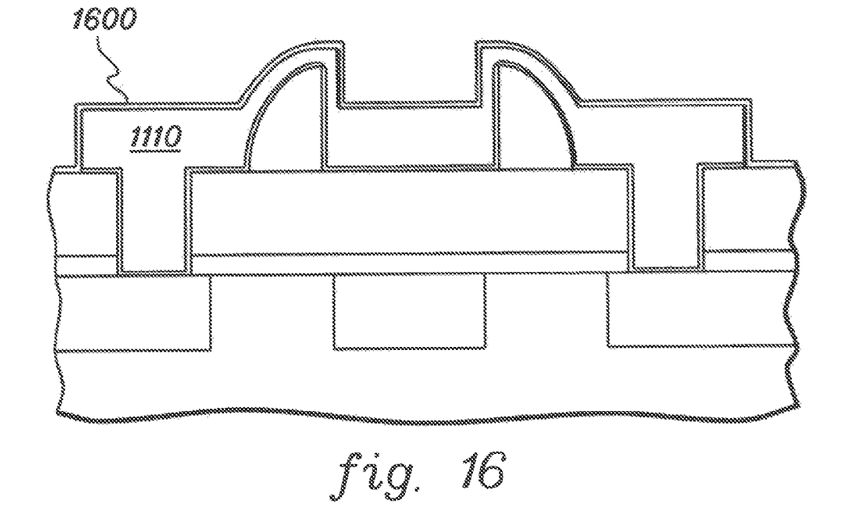
FIG. 16 is a cross-sectional elevational view of the structure of FIG. 13 after formation of a passivation liner 1600 over the overlying, patterned metal 1110, in accordance with an aspect of the present invention.

In FIG. 13B, the lower surface 1350 of fuse element 1330 is shown in a region of smallest surface area of curvature. This region of smallest surface area of curvature is shown to have a radius of curvature r, which is a maximum of 100 nanometers, in accordance with an aspect of the present invention. By providing the fuse element with a convex upper surface and a lower surface with a smallest surface area of curvature having a radius of curvature less than or equal to 100 nanometers, a region is defined in the fuse element where current density, heat generation and temperature rise are greatly enhanced with the passage of current through the element. This is illustrated in the temperature contours diagrams of FIGS. 14 & 15. FIGS. 14 & 15 depict simulated results obtained using a coupled electrical-thermal two-dimensional finite-element analysis. A commercially available FEMLAB Multiphysics program (offered Comsole, Inc. of Burlington, Mass.) was employed.

In FIG. 14, exemplary power dissipation density contours within the fuse structure are illustrated, wherein a "hot spot" at the top inside of the curved fuse element is identified. This hot spot has the highest power dissipation density within the fuse element, and thus, is a region prone to open circuit with the application of a programming voltage.

FIG. 15 depicts exemplary constant temperature contours within the fuse structure. In this embodiment, temperature contours are crowded in the insulating material above and below the fuse, but wider spaced in the metal, since metal is a good thermal conductor. Note that a peak temperature of approximately 1078 degrees is generated in the fuse structure when a current of only 5 mA is applied. In this exemplary case, the fuse cross-section normal to current flow is assumed to be 100 nm wide×50 nm thick. The simulation examples of FIGS. 14 & 15 confirm the operability of the e-fuse structures presented herein.

Figure 17:
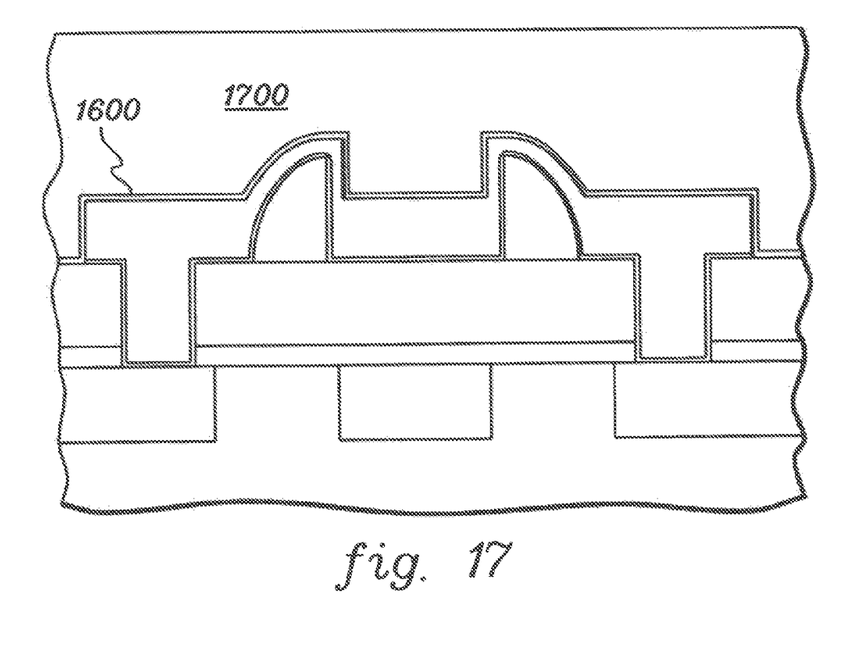
FIG. 17 is a cross-sectional elevational view of the intermediate structure of FIG. 16, after a photo-sensitive polyimide 1700 has been applied and cured, in accordance with an aspect of the present invention.
Figure 18:
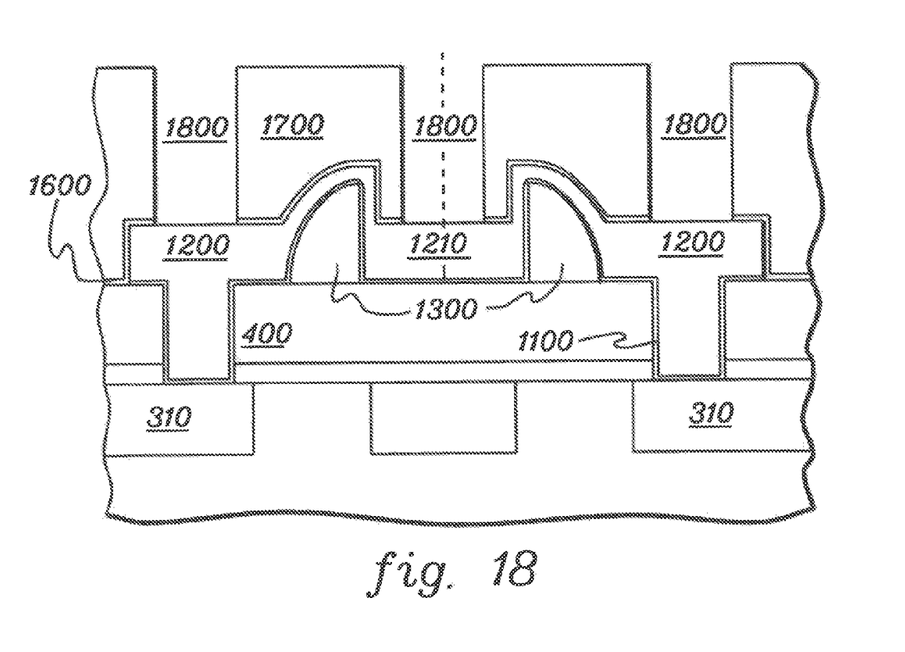
FIG. 18 is a cross-sectional elevational view of the structure of FIG. 17, after contact vias 1800 to the terminal portions 1200, 1210 of the fuse structures have been opened, in accordance with an aspect of the present invention.

Continuing with the fabrication approach of FIG. 13, a passivation liner 1600 is next conformably deposited, for example, by chemical vapor deposition (CVD) (see FIG. 16) over metal 1110. By way of example, liner 1600 may comprise silicon nitride or silicon oxide. A photosensitive polyimide 1700 is then applied over liner 1600 and cured, as shown in FIG. 17. Polyimide is an insulating layer typically used in BEOL processing to seal underlying layers from contaminants. Once the polyimide is cured, contact vias 1800 are opened in liner 1600 and polyimide 1700 to selectively expose the terminal portions 1200, 1210 of the fuse structure. As noted, the resultant structure in FIG. 18 can be employed as two separate fuses, or two fuses electrically connected in series. A first terminal portion 1200 of each fuse is electrically contacted both from below (via metal 310) and above (by a contact to be formed in via 1800), while a second terminal portion 1210, i.e., the terminal portion connecting the two fuses, is electrically contacted from only above, with a dielectric material 400 being disposed below. As noted, the resultant fuse structure has a fuse element with a vertical component that was formed conformably over a sacrificial spacer (which was subsequently removed to form void 1300). Again, the fuse element may have a minimum thickness of, for example, less than 5 nm, while the minimum overall length of the fuse may be less than 70 nm. The fuse structure can be implemented at FEOL, BEOL and/or FBEOL.

Figure 19:
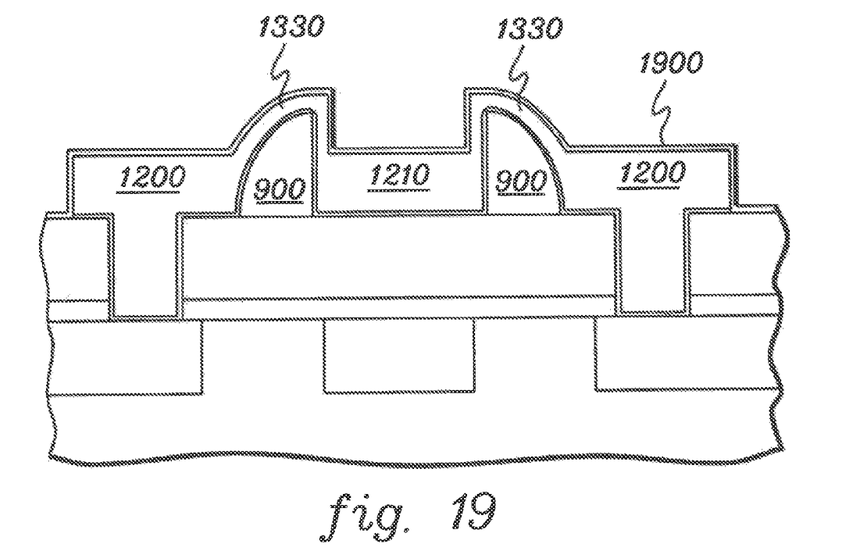
FIG. 19 is a cross-sectional elevational view of an alternate embodiment of an electrically programmable fuse fabrication approach wherein a passivation liner 1900 is disposed over the intermediate structure of FIG. 12, in accordance with an aspect of the present invention.
Figure 20:
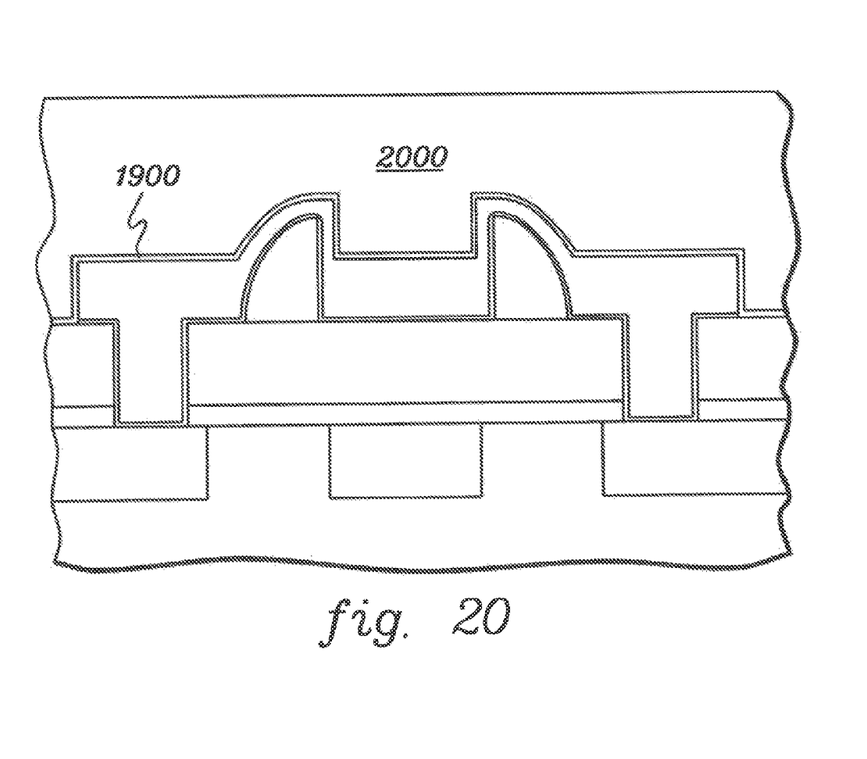
FIG. 20 is a cross-sectional elevational view of the structure of FIG. 19, after a photosensitive polyimide 2000 has been applied and cured, in accordance with an aspect of the present invention.
Figure 21:
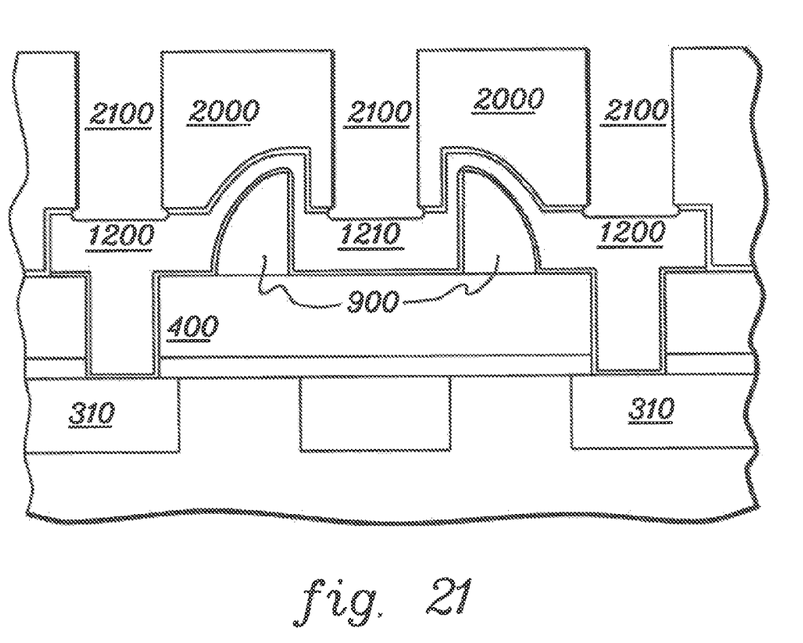
FIG. 21 is a cross-sectional elevational view of the structure of FIG. 20 after contact vias 2100 to the terminal portions 1200, 1210 of the fuse structure have been opened, in accordance with an aspect of the present invention.

As noted, FIGS. 19-21 depict an alternate embodiment of a fuse fabrication method, as well as an alternate embodiment of the resultant fuse structure. Returning to the intermediate structure of FIG. 12, the spacers 900 above which the fuse elements are conformably formed are to remain within the structure. Thus, a passivation liner 1900 is next deposited conformally over the first terminal portions 1200, second terminal portions 1210 and fuse elements 1330 of the fuses as shown in FIG. 19. Liner 1900 may comprise, for example, silicon nitride or silicon oxide.

Photosensitive polyimide 2000 is then applied over liner 1900 and cured as shown in FIG. 20. Contact vias 2100 are then opened in polyimide 1900 and the liner to expose the fuse terminal portions 1200, 1210 as shown in FIG. 21. This structure is similar to the fuse structure of FIG. 18, with the only difference being the presence of the spacer material 900 below the fuse elements of the fuse structures. More particularly, a first terminal portion 1200 of each fuse is electrically contacted both from below (via metal 310) and above (by a contact to be formed in via 2100), while a second terminal portion 1210 is electrically contacted from above only (again by a contact to be formed in the aligned via 2100), with dielectric material 400 being disposed below. The spacer material is preferably thermally insulative in order to facilitate open circuiting of the respective fuse structures with the application of an appropriate voltage.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. An integrated circuit fuse comprising:
   an electrically conductive material disposed above a substrate supporting an integrated circuit, the electrically conductive material comprising a first terminal portion and a second terminal portion interconnected by a fuse element;
   wherein the fuse element of the electrically conductive material has a convex upper surface and a lower surface with a radius of curvature at a smallest surface area of curvature less than or equal to 100 nanometers; and
   wherein the upper surface of the fuse element is convex for a majority of the distance between the first terminal portion and the second terminal portion, and the fuse element of the electrically conductive material comprises a thickness less than a thickness of the first terminal portion and less than a thickness of the second terminal portion.

2. The fuse of claim 1, wherein the fuse element resides over a void in a supporting structure above the substrate, the void being the absence of any material.

3. The fuse of claim 1, wherein the fuse element resides above a thermally insulating, dielectric spacer.

4. The fuse of claim 3, wherein the fuse element is conformably disposed over at least a portion of the thermally isolating, dielectric spacer.

5. The fuse of claim 4, wherein the thermally isolating, dielectric spacer has a quadrant-shaped cross-section.

6. The fuse of claim 1, wherein the upper surface of the fuse element extends for a portion thereof perpendicular to an upper surface of the substrate.

7. An integrated circuit comprising:
   an electrically conductive material disposed above a substrate supporting an integrated circuit, the electrically conductive material comprising a first terminal portion and a second terminal portion interconnected by a fuse element;
   wherein the fuse element of the electrically conductive material has a convex upper surface and a lower surface with a radius of curvature at a smallest surface area of curvature less than or equal to 100 nanometers; and
   wherein the lower surface of the fuse element is planar in a vertical direction for a portion thereof, and wherein the smallest surface area of curvature is adjacent to the planar portion of the lower surface, and the fuse element of the electrically conductive material comprises a thickness less than a thickness of the first terminal portion and less than a thickness of the second terminal portion.

8. The fuse of claim 7, wherein the planar portion of the lower surface of the fuse element is oriented orthogonal to a plane containing at least one of an upper surface of the first terminal portion or an upper surface of the second terminal portion.

9. The fuse of claim 7, wherein the upper surface of the fuse element extends for a portion thereof perpendicular to an upper surface of the substrate.

10. A fuse for an integrated circuit, the fuse comprising:
    a first terminal portion and a second terminal portion interconnected by a fuse element;
    wherein the fuse element has a convex upper surface and a lower surface with a radius of curvature at a smallest surface area of curvature less than or equal to 100 nanometers; and
    wherein the first terminal portion is electrically contacted from both above and below, and the second terminal portion is electrically contacted from above only, with a dielectric material being disposed below, and wherein the first terminal portion is electrically contacted from below via an underlying metal.

11. The fuse of claim 10, wherein the fuse is an electrically programmable fuse, the fuse element has a minimum thickness $T_{min} \leq 5$ nm between the upper surface and lower surface, and the fuse has a minimum length less than 70 nm, and wherein the fuse is programmable at an operating voltage of the integrated circuit less than 3 volts.

12. The fuse of claim 10, wherein enhanced current density, heat generation, and temperature rise are obtained in a region of the fuse element adjacent to the smallest area of curvature in the lower surface thereof having the radius of curvature less than or equal to 100 nanometers.

\* \* \* \* \*